United States Patent
Sareen et al.

(10) Patent No.: US 8,373,465 B1
(45) Date of Patent: Feb. 12, 2013

(54) ELECTRONIC DEVICE AND METHOD FOR PHASE LOCKED LOOP

(75) Inventors: Puneet Sareen, Freising (DE); Markus Dietl, Munich (DE); Ketan Dewan, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/299,069

(22) Filed: Nov. 17, 2011

(51) Int. Cl.
   *H03L 7/06* (2006.01)
(52) U.S. Cl. ......................... 327/156; 327/147
(58) Field of Classification Search .................. 327/147, 327/156
   See application file for complete search history.

(56) References Cited

U.S. PATENT DOCUMENTS

| | | | |
|---|---|---|---|
| 7,076,009 B2 * | 7/2006 | Wieck | 375/345 |
| 7,305,880 B2 * | 12/2007 | Caminada et al. | 73/504.04 |
| 2004/0105511 A1 * | 6/2004 | Wieck | 375/317 |
| 2006/0033588 A1 * | 2/2006 | Caminada et al. | 331/154 |
| 2008/0232480 A1 * | 9/2008 | Tuttle et al. | 375/259 |
| 2010/0148881 A1 * | 6/2010 | Moussavi | 331/36 C |
| 2011/0133799 A1 * | 6/2011 | Dunworth et al. | 327/157 |
| 2011/0228424 A1 * | 9/2011 | Dahle et al. | 360/134 |

* cited by examiner

*Primary Examiner* — Adam Houston
(74) *Attorney, Agent, or Firm* — John J. Patti; Wade J. Brady, III; Frederick J. Telecky, Jr.

(57) ABSTRACT

A phase locked loop (PLL) is provided. The PLL includes a control stage comprising N storage elements each having an output coupled to the output of the control stage. The N storage elements being coupled in a chain, and each storage element being configurable in an analog mode, where a stored signal at the storage node of the storage element is changed continuously in response to the output signal of a charge pump. Each storage element is configurable in a digital mode in which the stored value is one value out of a predetermined set of values, and the storage element can assume the analog mode if a preceding storage element and a subsequent storage element are in the digital mode and have different values of the stored signal.

13 Claims, 9 Drawing Sheets

ELECTRONIC DEVICE AND METHOD FOR PHASE LOCKED LOOP

CROSS-REFERENCE TO RELATED APPLICATIONS

This application claims priority from European Provisional Patent Application No. 11183369.5, filed Sep. 29, 2011, which is hereby incorporated by reference for all purposes.

TECHNICAL FIELD

The invention relates to an electronic device and a method for a phase locked loop, and more specifically to an electronic device and a method controlling the oscillation frequency of a controlled oscillator of a phase locked loop.

BACKGROUND

Phase locked loops are typically equipped with controlled oscillators, for example a voltage controlled oscillator (VCO). The VCO is coupled in a feedback loop in order to generate a high frequency clock from a low frequency reference clock. This reference clock is of a lower frequency since it is easier to generate various stable and precise clock signals at lower frequencies. An example of a phase locked loop according to the prior art is shown in FIG. 1. There is a VCO, a phase frequency detector PFD, a charge pump, a divider and a compensation capacitor C1SVS, an integrating analog element including a resistor R and a capacitor C2. The phase frequency detector PFD compares the phase of the reference clock REFCKL with the phase of the feedback clock signal SYSCLK which have basically the same clock frequency. The feedback clock signal SYSCLK is the clock signal PLLOUT output by the PLL and divided by the divider DIV. If the frequency or the phase of the feedback clock signal SYSCLK differs from the phase or frequency of the reference clock signal REFCLK, the charge pump CP applies a signal to the VCO in order to increase or decrease the phase or frequency of the output signal PLLOUT of the VCO. The signal ICH issued by the charge pump is a function of the difference between the reference clock REFCLK and the feedback clock signal SYSCLK.

The VCO may be implemented as a ring oscillator. The ring oscillator topology provides a series of cascaded delay stages (typically inverters). The output signal from the last delay stage is fed back to the input of the first delay stage. The total delay through the cascaded stages (including any net inversion of the signal within the system) is designed to satisfy criteria for sustained oscillation. Typically each delay stage has a variable delay governed by an independent input. The oscillation frequency of the VCO is then controlled by the input signal in order to vary the stage delay. The oscillation frequency for a ring oscillator can be tuned over a wide range, as for example 20% to 50% of the nominal center frequency of the VCO.

Prior art PLLs employ real time clock input signals in the range of 32 KHz and generate output signals PLLOUT with frequencies in the range of tens to hundreds of MHz. In order to comply with this rather low input frequency, the PLL has to have a very small bandwidth, for example in the range of 1 to 3 KHz or even smaller. Such a small bandwidth requires external components and also consumes a lot of power, in particular in case of digital PLLs. However, handheld and mobile devices require reducing the power consumption and the number of external components.

SUMMARY

It is a general object of the invention to provide a PLL that requires less external components and consumes less power than PLLs according to the prior art.

In an aspect of the invention, there is an electronic device which comprises a phase locked loop. The phase locked loop includes a phase frequency detector (PFD), a first charge pump, a controlled oscillator, a divider and a second charge pump. There is further a control stage. An output of the phase frequency detector is coupled to the first charge pump. The output of the first charge pump is coupled to a first control input of the controlled oscillator. The output of the phase frequency detector is also coupled to an input of the second charge pump. An output of the second charge pump is coupled to an input of the control stage. An output of the control stage is coupled to a second control input of the controlled oscillator. An output of the controlled oscillator is coupled to an input of the divider. An output of the divider is coupled to an input of the phase frequency detector.

The control stage comprises N storage elements. Each storage element may have an output coupled to the output of the control stage. The N storage elements are preferably coupled in a chain such that each storage element in the chain is coupled to a number of preceding storage elements and a number of subsequent storage elements. The term "preceding" refers to the position in the chain and means closer to the first storage element of the chain then the storage element at issue. "Subsequent" also refers to the position in the chain and means closer to the last storage element of the chain than the storage element at issue. In the chain configuration, the first storage element and the last storage element may not have two neighbors. The first storage element may not have a preceding storage element and the last storage element in the chain will not have a subsequent storage element. The preceding storage element and the subsequent storage element may not be the direct neighbors of the storage element but they may have a position further away from the storage element.

According to an aspect of the invention, at least two storage elements share a storage capacitance. This means that at least two or more storage elements can be alternatively coupled to a storage capacitance for charging and discharging the storage capacitance. Each storage element may then not comprise a storage capacitance by itself.

In an aspect of the invention, the two storage elements that share a shared storage capacitor should not be direct neighbors in the chain of storage elements. The stored signal may then be the voltage level at one side (plate) of the capacitance. Sharing storing capacitors (storage capacitance) between multiple storage elements can substantially reduce the number of required storage capacitors and thereby the area needed for implementing the storage capacitance (especially in a integrated semiconductor circuit).

In an embodiment, only k storage capacitors (capacitances) are provided which are shared among all the storage elements. The parameter k is then a positive integer number greater than 2. In this embodiment, the number of storage elements that share one capacitor is the total number of storage elements divided by k. In other words, each k-th neighbor storage element of a storage element uses the same capacitor. This reduces the number of storage capacitors by a factor equal to the number of storage elements divided by k. In an advantageous embodiment, the number of storage capacitors can be four (k=4). If for example, 200 storage elements are used, the number of storage capacitors is reduced by a factor of 200 by 4 which is equal to 50.

The voltage level on the storage capacitance may be changed by adding and removing charge from the shared capacitance.

Each storage element may then comprise a transmission gate which is coupled between the internal storage node of the storage element and a storage capacitor.

The transmission gate of each storage element is controlled by an output of a storage element that is not a direct neighbor of the storage element. This provides that any handover of storage capacitors between storage elements does not affect the active storage elements in the chain.

The storage capacitance may then be charged and discharged in response to the output signal of the second charge pump. The control gates of the switches (transistors) in the storage elements may then be coupled to the output of the charge pump. The discharging and the charging of the shared storage capacitance may then be disabled, if the storage element is in the digital mode (either the first switch or the second switch is closed (connecting)).

Each storage element may then be configurable to assume an analog mode. In the analog mode, a stored signal at a storage node of the storage element can be changed continuously in response to the output signal of the second charge pump.

Furthermore, each storage element may be configurable to assume a digital mode. In the digital mode, the stored value is one value out of a predetermined set of values. The storage element may be further configured to assume the analog mode, if a preceding storage element and a subsequent storage element are in the digital mode and have different values of the stored signal.

Accordingly, these aspects of the invention provide a semi digital phase locked loop that is controlled by a number of storage elements being configurable in an analog mode and a digital mode. In the analog mode, the output signal of the storage element can continuously vary. In the digital mode, the output signals are fixed (kept a constant value, i.e. for example high or low). The output signal may then be logic high or logic low in the digital signal. The usually required large loop filter capacitance can be replaced by the semi digital circuit arrangement using the storage elements according to this aspect of the invention. The electronic device in accordance with these aspects of the invention consumes very low current and does not require external components. Furthermore, the chip size required for an integrated implementation of the electronic device according to the invention is also very small.

Preferably, an analog loop damping mechanism is used in combination with the semi digital phase locked loop configuration.

In an aspect of the invention, the storage element may be configured to assume the digital mode if a preceding and a subsequent storage element are in digital mode and have the same values of the stored signals.

In an embodiment, at least the preceding storage element and/or the subsequent storage element may be the direct neighbors of the storage element that is in analog mode.

In an embodiment, at least the preceding storage element and/or the subsequent storage element may be the direct neighbors of the storage element changes from analog mode to digital mode and/or vice versa.

Furthermore, each storage element may be configured to produce an output signal which may then be a function of the stored signal (stored signal in the storage element). This output signal may then be fed to the controlled oscillator for adapting the oscillation frequency of the controlled oscillator.

Accordingly, the controlled oscillator may be controlled by the output signals of the storage elements. As some of the storage elements are in digital mode and others (preferably two storage elements at the same time which are direct neighbors) are in analog mode, the controlled oscillator is controlled by a combination of digital and analog output signals of the storage elements. This aspect of the invention provides a control mechanism that employs digital signals but is not limited to a specific number of discrete control steps. Using a mere digital signal for controlling the controlled oscillator is always limited to a number of discrete steps. The invention provides a mechanism, where the storage elements automatically switch into analog mode in order to cover the range between the discrete steps. The resolution of the control mechanism is therefore basically infinite. However, since only one or two storage elements are in analog mode, the control circuit provides a very robust and reliable mechanism using a comparatively small number of components (i.e. storage elements).

The storage node in the storage element may be coupled to a gate of a transistor for controlling a current through the transistor. This current may then be used as the output signal of the storage element. The current may be fed to the controlled oscillator for adapting and varying the clock frequency of the controlled oscillator. Directly feeding a current to the controlled oscillator further reduces the sensitivity of the circuit to disturbances and this very efficient in terms and number of components. The output current of the storage element serves as the digital signal, indicating the digital state if the storage element is in digital mode. Furthermore, the output current of the storage element is an analog output signal continuously varying between minimum and maximum values if the storage element is in analog mode.

In a preferred embodiment, the storage element may comprise a first switch and a second switch. The first switch may be coupled between a first supply voltage and the storage node of the storage element. The second switch may be coupled between a second supply voltage and the storage node of the storage element.

The first switch may then be configured to switch in response to the stored signal of a preceding storage element and also in response to the level of the stored signal of a subsequent storage element.

The second switch may also be configured to switch in response to the level of the stored signal of a subsequent storage element and the level of a stored signal of a preceding storage element.

The first switch may then be configured to only close (connect the storage node to the first supply voltage) when both stored signals (of preceding and subsequent storage element) are below a predetermined threshold level(s).

The second switch may be configured to only close (connect the storage node to the second supply voltage) when both storage signals (of preceding and subsequent storage element) are above a predetermined threshold level(s). This means that the storage node is either pulled to the first supply voltage level (e.g. VDD) or down to ground level.

If the levels of the stored signals of the preceding storage element and the subsequent storage element are different, the storage node is neither pulled to the first supply voltage level nor to the second supply voltage level. As explained with respect to the other aspects of the invention, the storage element is then in the analog mode.

The first switch may comprise two transistors and the second switch may also comprise two transistors. The two transistors may be coupled with their control gates to the storage nodes of the subsequent and preceding storage elements, respectively.

The set of predetermined values to which the stored signal of the storage element is switched in digital mode may comprise two values. Accordingly, the storage element may then be a binary storage element. The values may then be a minimum value and a maximum value. The minimum value may be ground and the maximum value may be supply voltage level.

The invention also provides a method of controlling a controlled oscillator. A phase and/or frequency difference between an output clock signal of the controlled oscillator and a reference clock signal may be determined. A first input signal for the controlled oscillator may be generated. This first control signal may be used for fine tuning the frequency of the controlled oscillator. The fine tuning may be based on the determined phase and/or frequency difference. A second input signal for the controlled oscillator may then be generated. This second input signal may be used for a coarse tuning of the frequency of the controlled oscillator. Also this second input signal may be determined based on the phase and/or frequency difference of the reference signal and the output clock signal of the controlled oscillator. The second signal may comprise a digital, i.e. a quantized portion and an analog, i.e. not quantized portion. The digital portion may be formed by a first set of digital signals and a second set of digital signals. The analog portion may be configured to indicate an intermediate value between the value of the first set of digital signals and the value of the second set of digital signals. The value of the first set of digital signals may be proportional to or correspond to the number of digital signals being logic high. The value of the second set of digital signals may be proportional to or correspond to the number of digital signals being logic high. This aspect of the invention provides that the range between the digital value represented by the first set of digital signals and the digital value represented by the second set of digital signals is then covered by the analog signal The storage elements may then be controlled to be selectively coupled to only a small set of shared storage capacitors. Each k-th neighbor of the chain of storage elements may then use the same storage capacitor at a different time.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EXAMPLE EMBODIMENTS

Figure 1:
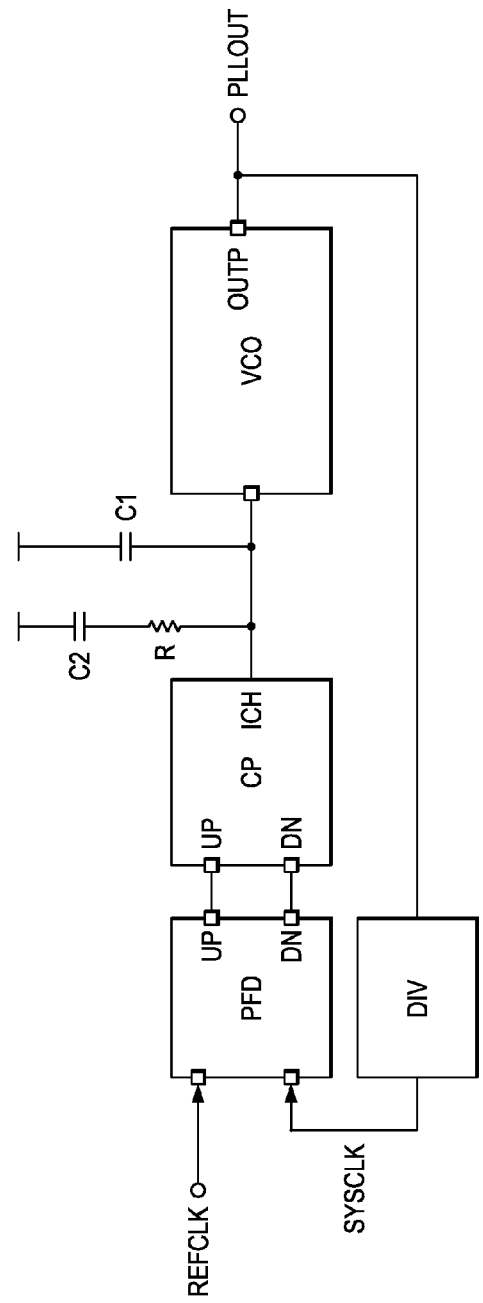
FIG. 1 shows a phase locked loop according to the prior art.
Figure 2:
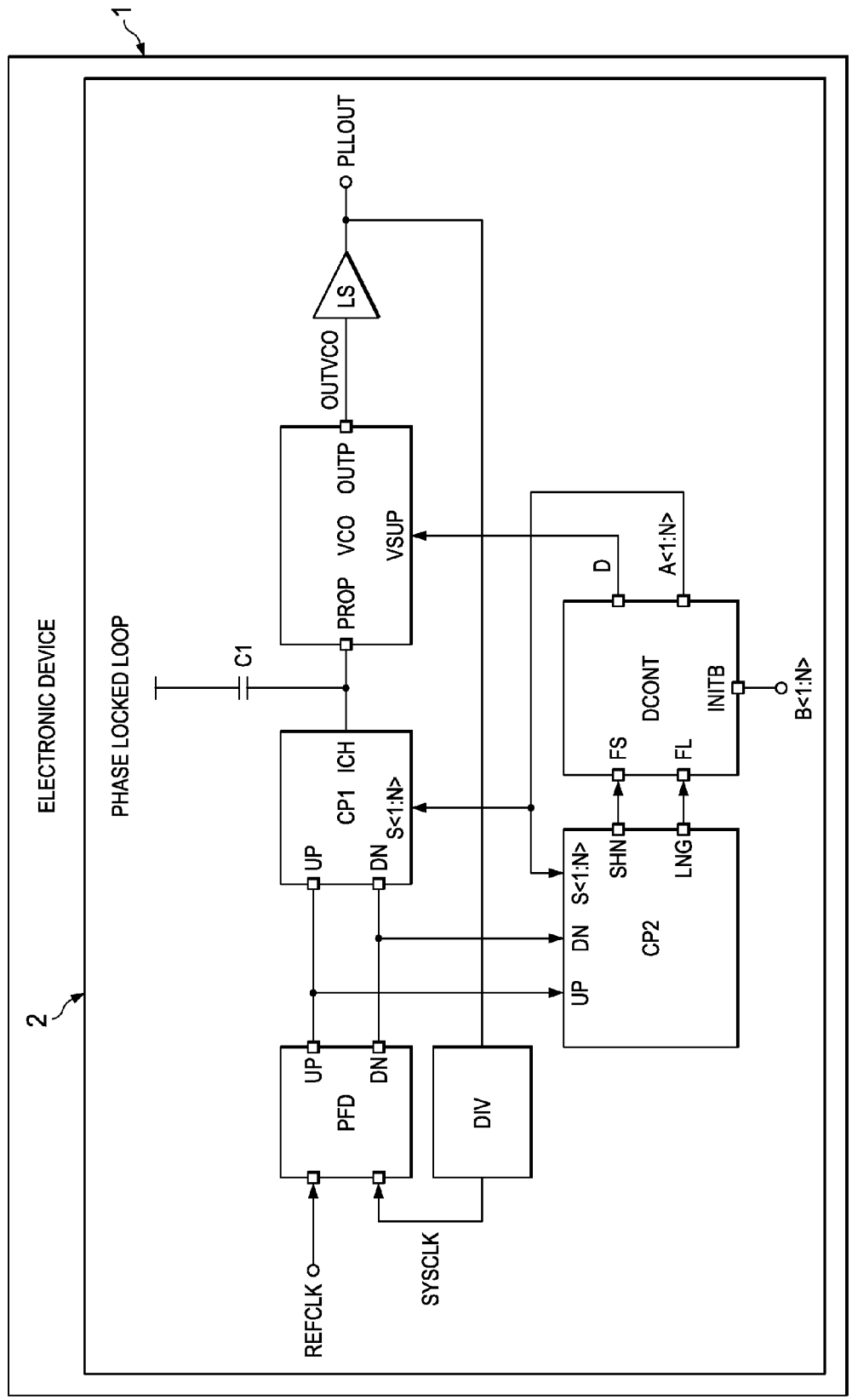
FIG. 2 shows a simplified circuit and block diagram of a phase locked loop according to the invention.

FIG. 2 shows an electronic device 1 including a phase locked loop PLL 2 in accordance with aspects of the invention. The PLL 2 includes a phase frequency detector PFD, the output of which is coupled to an input of a first charge pump CP1. The output of the first charge pump CP1 is coupled to an input of the controlled oscillator VCO and to one side of a loop capacitor C1. The other side of loop capacitor C1 is coupled to ground or a supply voltage level. The output OUTVCO of the controlled oscillator VCO is coupled to an input of a level shifter LS is the PLL output signal PLLOUT. The controlled oscillator is a voltage controlled oscillator VCO in this embodiment. The output signal PLLOUT is coupled back to a divider DIV. Divider DIV divides the clock frequency of the output signal PLLOUT and provides the clock signal SYSCLK. This signal SYSCLK is fed back to an input of the phase frequency detector PFD. The other input of the phase frequency detector PFD receives a reference clock signal REFCLK.

Furthermore, in accordance with aspects of the invention, there is a second charge pump CP2 and a delay control stage DCONT. The second charge pump CP2 is also coupled to receive the output of the phase frequency detector PFD. The outputs SHN and LNG of the second charge pump CP2 are coupled to inputs of the delay control stage DCONT. These inputs of the delay control stage DCONT are FS and FL. FS refers to increasing speed (increasing the frequency of the oscillation frequency of the VCO) and FL refers to decreasing speed (decreasing the frequency of the clock signal of the VCO). The delay control stage provides an output signal D which is fed to a second input FSUP of the VCO.

The reference clock REFCLK can be an input clock derived from a real time clock of the electronic device 1. The frequency of the reference clock signal REFCLK may be in the range of or at 32 KHz. This low input frequency usually requires a loop bandwidth of the PLL 2 in the range of 1 KHz to 3 KHz. The reference clock signal REFCLK is directly fed to the phase frequency detector PFD. The phase frequency detector PFD may be a conventional phase frequency detector which is configured to compare the phases of reference clock signal REFCLK and the feedback clock signal SYSCLK. The phase frequency detector generates up-signals UP and down-signals DN based on the detected phase/frequency difference. The two outputs UP and DN are fed to the first charge pump CP1 and the second charge pump CP2.

The level shifter LS at the output of DVCO is only optionally required if DVCO is not arranged for producing a full swing output clock signal OUTVCO. The output of the level shifter (or, in an alternative embodiment, the output of DVCO) is then the feedback and output signal PLLOUT of the PLL 2. The divider DIV defines the clock multiplication factor. The output of the divider is fed back as signal SYSCLK to the input of the phase frequency detector PDF.

The output signal D of the delay control stage DCONT is preferably an analog signal. In an embodiment, the output signal D may be a current. The delay control stage DCONT also generates a digital signal A<1:N>. A<1:N> represents the content/value of the signals stored in the delay control stage DCONT. These digital bits are fed back to the first charge pump CP1 and the second charge pump CP2. They are used for compensating variations due to temperature, supply voltage or production spread.

Figure 3:
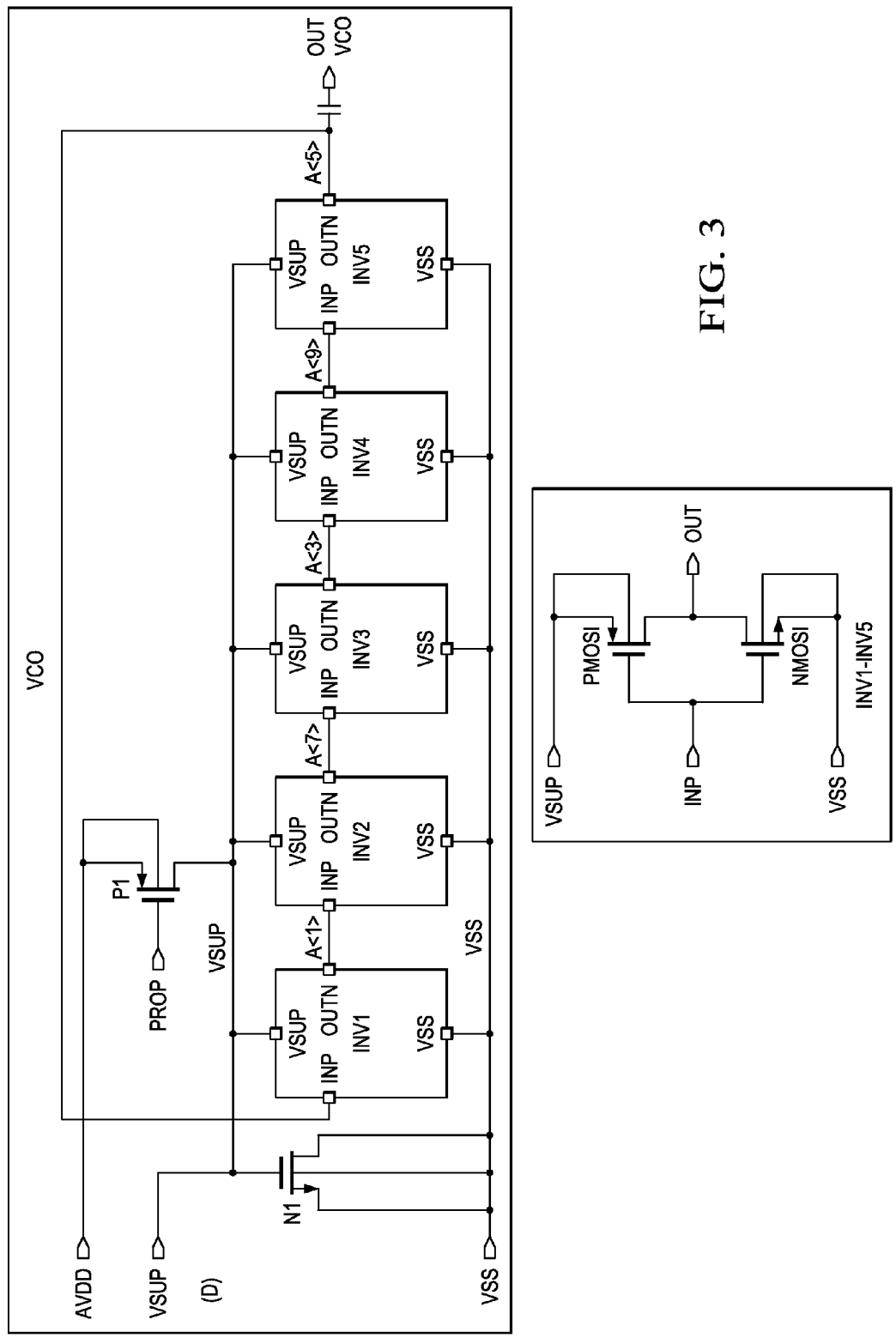
FIG. 3 shows a simplified circuit diagram of the controlled oscillator according to an embodiment of the invention.

FIG. 3 shows a simplified circuit diagram of an embodiment of the VCO that can be used in the phase locked loop according to an embodiment of the invention. The VCO includes five delay stages INV1, INV2, INV3, INV4 and INV5. The output OUTVCO of the delay stage INV5 is coupled to the input of the first delay stage INV1 of the VCO. The VCO is implemented as a ring oscillator. All stages INV1 to INV5 are connected in series. The last stage INV5 provides a feedback to the first stage INV1. The delay stages INV1 to INV5 may all be implemented as shown in the lower part of FIG. 3. Accordingly, the delay stages INV1 to INV5 are configured as inverters including a PMOS transistor PMOSI and a NMOS transistor NMOSI. The channels of the PMOS transistor PMOSI and the NMOS transistor NMOSI are coupled together as usual for an inverter. The control gates of PMOS transistor PMOSI and NMOS transistor NMOSI are coupled to receive the input signal from the previous stage. The output signal OUT of the inverter is then coupled to the next stage. The VCO further comprises a PMOS transistor P1 which defines the gain for the analog damping. The current through PMOS transistor P1 in combination with the current received through node VSUP defines the frequency of the oscillator. VSUP is coupled to receive the output signal of the delay stage DCONT. The output of the delay stage DCONT is the signal D. The PMOS transistor P1 receives an input signal PROP at the control gate. This input signal PROP is the first input signal of the VCO for defining the analog damping (fine tuning of the oscillation frequency) in response to the output of the first charge pump CP1 shown in FIG. 2. The second input of the VCO VSUP is coupled to the output of the delay control stage DCONT. This serves to provide the coarse tuning.

Figure 4:
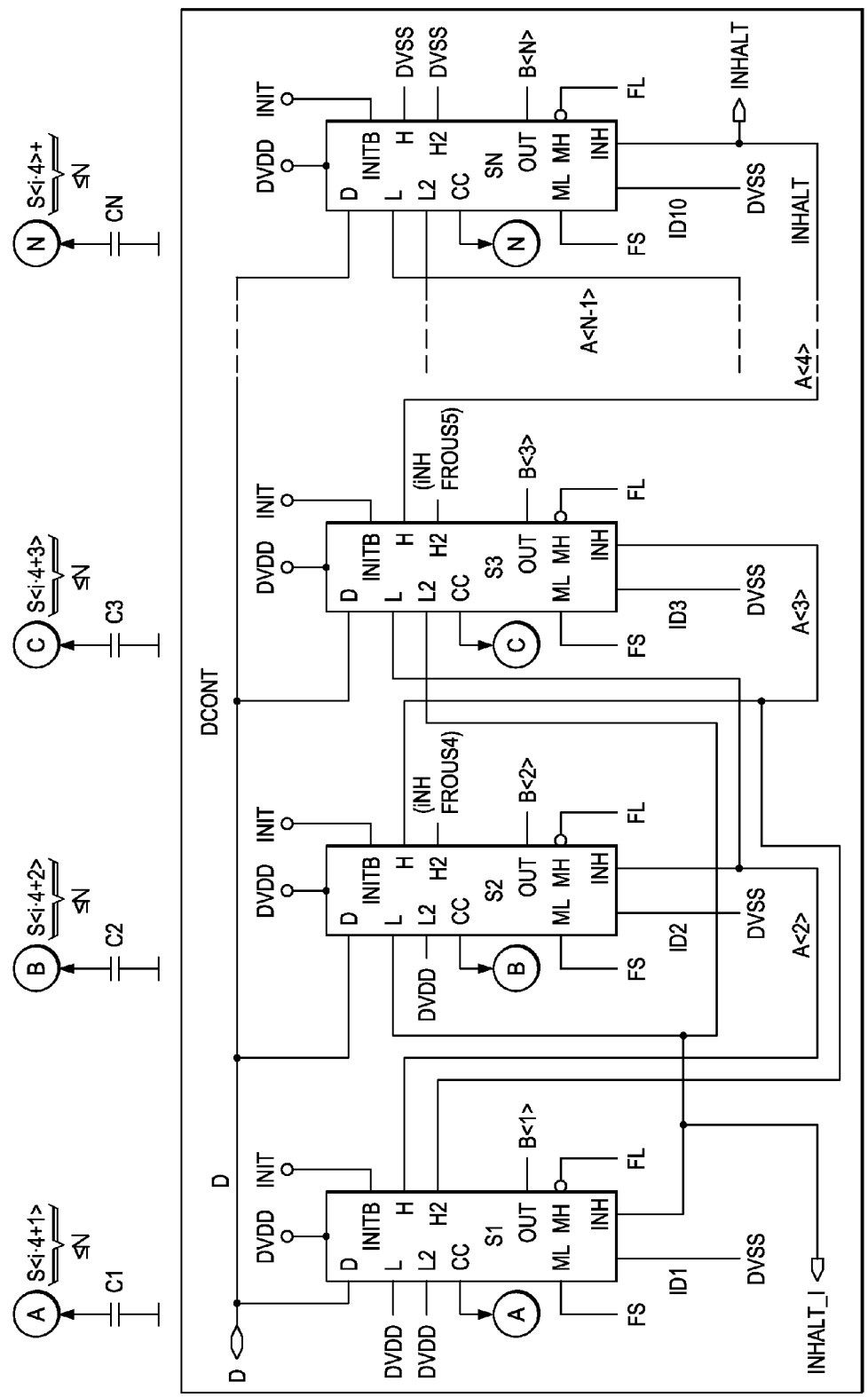
FIG. 4 shows a simplified circuit diagram of a delay control stage according to an embodiment of the invention.

FIG. 4 shows the delay control stage DCONT in more detail. The delay stage comprises a number N of storage elements S1 to SN. N may be about 200. Each storage element has an input L, an input H, an input L2, an input H2, an input FS and an input FL, an input INITB, an output OUT and an output CC, as well as an output INH.

The output INH of one storage element is coupled to the input L of the subsequent storage element and to the input H of the preceding storage element.

Furthermore, the output INH provides the signal A<1:N> which is fed back to the charge pumps CP1 and CP2 as shown in FIG. 2.

The signals B<1:N> are used for initializing the storage elements to specific initial values.

Signals INITB are used for initializing the storage elements. The storage elements S1 to SN are coupled in a chain. The first storage element S1 has no preceding storage element. The last storage element SN has no subsequent storage element. The other storage elements Si (S2 to SN−1) always have respective preceding and subsequent storage elements. For example, storage element S2 has a preceding storage element S1 and subsequent storage elements S3 to SN. Storage element S3 has subsequent storage elements S4 to SN and preceding storage elements S1 and S2.

In more general terms, a storage element Si has a preceding storage elements S1 to Si−1 and subsequent storage elements Si+1 to SN. The functionality and the content of a storage element Si is then defined by the value or values stored in one or more of the preceding storage elements S1 to Si−1 and the value or values stored in one or more subsequent storage elements Si+1 to SN.

The storage elements that decide about the mode of operation and the content of the storage element Si may not be the direct neighbors of Si, but one or more preceding and subsequent storage elements in more distant positions from Si in the chain. Accordingly the content and operation mode of a storage element Si may then be defined by the value stored in a preceding storage element Si−K1 and the value stored in a subsequent storage element Si+K2. K1 and K2 can then be positive integers greater than 1.

The individual storage elements S1 to SN are all connected at node D. This node D is a combined output signal of the delay control stage DCONT. Furthermore, the input pins ML and FS are also connected together and are the same for all storage elements S1 to SN. The same applies for MH and FL. The input pins INITB are also connected together at node INIT. Signal INIT can be used to initialize all storage elements S1 to SN at once.

For storage element S2, the inputs H and L can have four possible values. Either low-low, low-high, high-low or high-high.

There are further k=4 shared storage capacitors C1, C2, C3 and C4. Instead of providing a storage capacitor in each storage element S1 to SN, the capacitors are shared among the storage elements S1 to SN. Each of the storage capacitors C1 to C4 can be charged and discharged by the storage elements according to a specific order.

For example storage element S3 receives input signal L from storage element S2, signal L2 from storage element S1, signal H from storage element S4 and signal H2 from storage element S5. Signals L2 and H2 control the connection of the storage capacitor C3 to storage element S3. Signals L and H are used for controlling the charging and discharging of the storage capacitor C3 performed by the storage element S3.

In a first scenario, there might be a continuous UP-signal from the phase frequency detector PFD (shown in FIG. 2). In this scenario, the charging of the storage elements starts with storing element S1 and continues consecutively with storage elements S2, S3, S4 up to a storage element Si. Output CC of storage element S1 is coupled to one side of capacitor C1. During initialization (power up) all storage cells S1 to SN are initialized at a voltage level that corresponds to logic LOW. If the voltage level on storage capacitor C1 reaches, for example half the supply voltage level VDD/2 as it is charged through output CC of storage element S1. Signal L2 changes from LOW to HIGH for storage element S3 and signal L assumes also a logic level HIGH for storage element S2. In this situation, signal H2 is at logic LOW for storage element S3 due to the previous power-up sequence. This enables the two internal transmission gates (shown in FIG. 5) of storage element S3 (i.e. the transmission gates are turned on=connecting). The storage capacitor C3 is then connected to the output node OUT (=storage node SNOD) of storage element S3 at output CC.

As previously described, two storage elements are always active while the remainder of the storage elements is not active during the operation of the PLL according to the invention. During initialization, storage element S1 is active and signals L and L2 are connected to supply voltage level VDD. Storage element S2 is then activated and its output CC is coupled to C2. C1 is then charged by storage element S1 and the voltage level at the internal storage node SNOD rises. After charging of the storage node SNOD (or output node OUT) of the storage element S2 to half the supply voltage level VDD/2, signal L of storage element S2 that is coupled to storage element S3, signal L2 of storage element S2 that is coupled to storage element S4 and signal H of storage element S2 that is coupled to storage element S1 are changed to logic HIGH. This provides that storage element S3 becomes active and storage capacitor C4 is connected to the output node (or storage node SNOD) of storage element S4 through output CC. Storage element S1 is then not active and its output OUT is digitally wired to VDD.

Since the output OUT of storage element S1 is wired to VDD, the storage capacitor C1 becomes available and can be used for example by storage element S5, if this is required. In this situation, storage elements S2 and S3 are active and the remainder of the storage elements is not active. In the next step, storage capacitor C3 is charged through storage element S3. As soon as the output node OUT (or storage node SNOD) of storage element S3 reaches half the supply voltage level VDD/2 the storage element S4 is activated. The output OUT of storage element S2 is then wired to the supply voltage level VDD and the storage capacitor C1 is connected to the output of the storage element S5. The storage capacitor C1 is charged to supply voltage level VDD through storage element S1. If storage capacitor C1 is then connected to, for example to storage element S5, storage capacitor C1 is discharged to ground (logic LOW), as the output OUT of storage element S5 is digitally wired to logic LOW. This enables the storage capacitor C1 and makes it available for charging thereby avoiding any voltage glitches at the input of the voltage controlled oscillator VCO. Voltage glitches can occur due to any pre-charge of storage capacitor C1. As soon as the output OUT (output signal CC) of storage element S4 reaches half the supply voltage level VDD/2 storage element S5 is activated and the output OUT of storage element S3 is wired to the supply voltage level VDD thereby deactivating storage element S3. The storage capacitor C3 is then available. As soon as signal L2 of storage element S5 turns to HIGH (L2 of S5 is coupled to S7), the shared storage capacitor C3 is connected to storage element S7 in order to charge the shared storage capacitor C3. Since two storage elements are always active, a smooth transition from one frequency to higher frequencies can be achieved. This smooth frequency transition prevents any frequency glitches and thereby any undesired jitter of the PLL output.

For a continuous DOWN signal from the phase frequency detector PFD to the second charge pump CP2, a continuous SLOW pulse (signal LNG) is fed to switching transistors (N2 shown in FIG. 5) in the storage elements. In this situation, the handover of the shared capacitors C1 to C4 is performed from the most right storage element SN to the most left storage element S1. For example, capacitor C3 is handed over from storage element S7 to storage element S3. Storage capacitor C2 is handed over from storage element S6 to storage element S2. Storage capacitor C1 is handed over from storage element S5 to storage element S1.

In a scenario, in which for example storage elements S1 to S5 have been charged in response to a previous UP-signal during a PLL locking procedure, it might be further assumed that for example storage elements S5 and S6 are the active storage elements. With a rising edge of the DOWN signal, the storage elements S5 and S6 start discharging their respective shared capacitors C1 and C2. As soon as the output signal INH of storage element S5 reaches half the supply voltage level VDD/2, signal H2 from storage element S5 that is fed to storage element S3 turns to LOW. Furthermore, signal H from storage element S5 being fed to storage element S4 turns to LOW and signal L from storage element S5 fed to storage element S6 turns to LOW. Accordingly, the output INH of storage element S6 is wired to logic LOW. Since signal H and L are logic HIGH (storage element S3 is at voltage supply level VDD) storage element S4 is activated. Since the signals L2 and R2 are logic HIGH, storage element S3 is connected to shared storage capacitor C3 in order to provide for discharging the capacitor C3. Furthermore, capacitor C2 is decoupled from storage element S6 (digitally wired to logic LOW) and is therefore available for storage element S2, if this is required. The storage capacitor C3 was previously connected to storage element S7, the output INH of which is now wired to logic LOW. Therefore the voltage level across capacitor C3 is also at logic LOW. However, when storage capacitor C3 is connected to storage element S3 and the output INH of storage element S3 is wired to logic HIGH, storage capacitor C3 is charged to the supply voltage level VDD within a very short time. In an embodiment of the invention, this time period for charging the storage capacitor (in this example C3) is very short in order to prepare the storage capacitor C3 for the next storage cell that may be configured to discharge the capacitor. As soon as storage element S3 receives a logic LOW at signal H from storage element S4, storage element S3 is activated and discharges capacitor C3 in order to achieve the required frequency change. Accordingly, a fine tuning of the frequency of the voltage controlled oscillator VCO is achieved through charging and discharging of storage elements using the capacitance sharing principle according to aspects of the invention. Fully charged or discharged storage elements store the digital information of the frequency step of the voltage control oscillator and the active storage element pair provides the required analogue fine tuning of the frequency.

Figure 5:
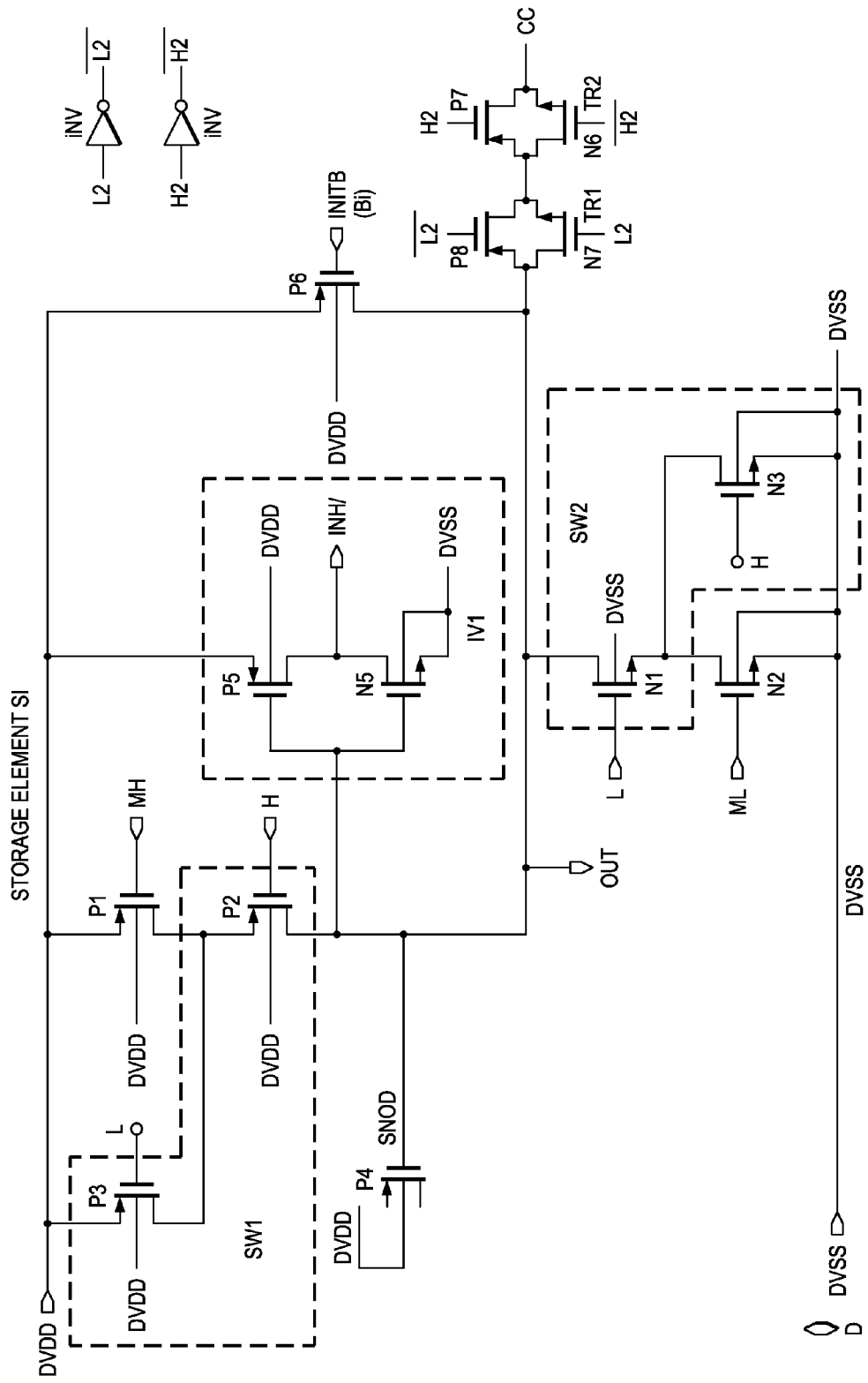
FIG. 5 shows a simplified circuit diagram of a storage element according to an embodiment of the invention.

FIG. 5 shows a storage element Si in more detail. The storage node SNOD is coupled to the control gate of a PMOS transistor P4. The source of PMOS transistor P4 is coupled to a supply voltage level DVDD. The drain of PMOS transistor P4 is coupled to the output node D. The storage node SNOD is also coupled to a first switch SW1 and a second switch SW2.

The first switch SW1 is configured to couple the storage node to a first supply voltage level DVDD in response to signals L and H. The second switch SW2 is configured to connect the storage node SNOD to the second supply voltage level DVSS in response to signals L and H. Signals L and H are input signals from the preceding and subsequent storage elements as shown in FIG. 4. The storage node SNOD is also coupled to the gates of PMOS transistor P4 and NMOS transistor N5. PMOS transistor P4 and NMOS transistor N5 form an inverter INV1 which serves to buffer and invert the stored signal on storage node SNOD. The stored content of the storage element Si is then provided in form of a digital signal at the output signal INH at the output of inverter INV1. In order to initialize the storage element Si, a signal INITB is used and coupled to the control gate of a PMOS transistor P6. If INITB is low, the storage node SNOD is coupled to DVDD and pulled to the first supply voltage level DVDD.

The storage element Si can be configured in two modes. A first mode may be referred to as analog mode. The second mode may be referred to as digital mode. The storage element Si is in digital mode, if either switch SW2 or switch SW1 couple the storage node SNOD to the first supply voltage level DVDD or to the second supply voltage level DVSS. Accordingly, the voltage level at node SNOD may be either DVSS or DVDD. This can be considered on out of two different digital values (high and low). However, if neither switch SW1 nor switch SW2 are closed (connecting) the voltage level at the storage node SNOD may be changed in response to signals MH and ML. These signals are received from the second charge pump CP2. If for example input signal H is low (below threshold voltage level of transistor P2) and signal MH is also low, a current can flow from DVDD to the storage node SNOD. If however signal L is high, then a current can flow from storage node SNOD to the second supply voltage level DVSS if signal ML is also above the threshold voltage level of N2.

A signal H is received from the subsequent storage element Si+1. A signal L is received from the preceding storage element Si−1. As shown in this figure, the signal INH is the inverted stored signal at storage node SNOD. If signals H and L are both at low level (below the threshold values of the respective transistors to which they are coupled) PMOS transistor P2 and PMOS transistor P3 are enabled and NMOS transistor N1 and NMOS transistor N3 are disabled. Accordingly, capacitor terminal OUT is pulled to the high voltage level DVDD. If H and L are both at high level (above or below the respective threshold voltage levels of the transistors), the capacitor terminal OUT or the storage node SNOD is pulled to the second supply voltage level DVSS. As soon as the voltage at the storage node SNOD exceeds the threshold level of the inverter INV1 formed with PMOS transistor P5 and NMOS transistor N5, the level at the node INH changes from high to low or low to high depending on whether the voltage at the storage node SNOD increases or decreases.

The shared capacitors (for example C1 to C4 as shown in FIG. 4) can selectively be coupled to the storing node SNOD (=OUT) through transmission gates. There are two transmission gates TR1 and TR2 coupled in series between the storage node SNOD and output node CC.

If signals H and L are both low, the shared capacitor is pulled to high voltage level. If signals H and L are low and high, the shared capacitor keeps its voltage. If signals H and L are at high level, the capacitor voltage is pulled down to low level. At the beginning (power-up, initialization), all storage elements S1 to SN are initialized to high level. This means that the PMOS transistor P6 which is coupled to the storage node SNOD does not supply any current.

Accordingly, the VCO does not receive any current from the delay control stage DCONT. Therefore, the VCO oscillates at the lowest oscillation frequency. In order to comply with the required frequency and phase of the reference input clock REFCLK, the phase frequency detector PFD and subsequently the charge pump CP2 issue signals in order to increase the frequency of the VCO.

The phase frequency detector generates pulses UP at the output node. In response to these UP-pulses, the second charge pump CP2 generates a reference voltage at node SHN. This node SHN is connected to input FS of the delay control stage.

The storage element S1 is connected to ML and tries to discharge the storage node and thereby the shared capacitor (not shown). Storage elements S2 to SN have both terminals H and L at low level. Therefore, the respective storage capacitors as far as coupled to any of storage elements S2 to SN are pulled high through transistors P2 and P3. However, as soon as the stored signal at storage node SNOD of storage element S1 falls below the threshold voltage of inverter INV1 (the threshold voltage level of inverter INV1 may be at half the first supply voltage level DVDD (DVDD/2)), the signal INH of storage element S1 changes from low to high. This change from low to high of signal INH of storage element S1 disables that storage node SNOD in storage element S2 is pulled to the first voltage level (high) as transistor P3 is turned off. As a consequence, the two shared capacitors that may be coupled to CC of storage elements S1 and S2 are affected by the up and down pulses (signals UP and DN) issued by the phase frequency detector PFD. As soon as the voltage level at node SNOD in storage element S2 exceeds the threshold voltage level of the inverter INV1 of storage element S2, storage element S3 is activated. As soon as storage element S3 is activated, the input signal H of storage element S1 receives a high voltage level and transistors N1 and N3 of storage element S1 are activated. The voltage level at storage node SNOD is now pulled down to the second supply voltage level DVSS (ground). This means that always two storage elements are active for analog tuning and all other storage elements are in digital mode, which means they are high or low in response to the values of their neighbors.

The two transmission gates TR1, TR2 comprise respective PMOS and NMOS transistors P7, P8, N6 and N7 which are controlled through signals L2 and H2. The transmission gates TR1, TR2 are used to couple and decouple the output node to and from node CC (and thereby to and from storage node SNOD) to respective shared capacitors. In particular, if a storage element is not active and not close to the active storage elements, the output OUT/storage node SNOD should be decoupled from the respective capacitor in order to make it possible that other storage elements use the shared capacitor. The control signals L2 and H2 are received from storage elements which are not the direct neighbors but neighbors next to the direct neighbors to the right and to the left of the storage elements (second neighbors). In order to control the transmission gates, the complementary signals of H2 and L2 are generated by inverters INV as shown on the right top of FIG. 5.

Figure 6:
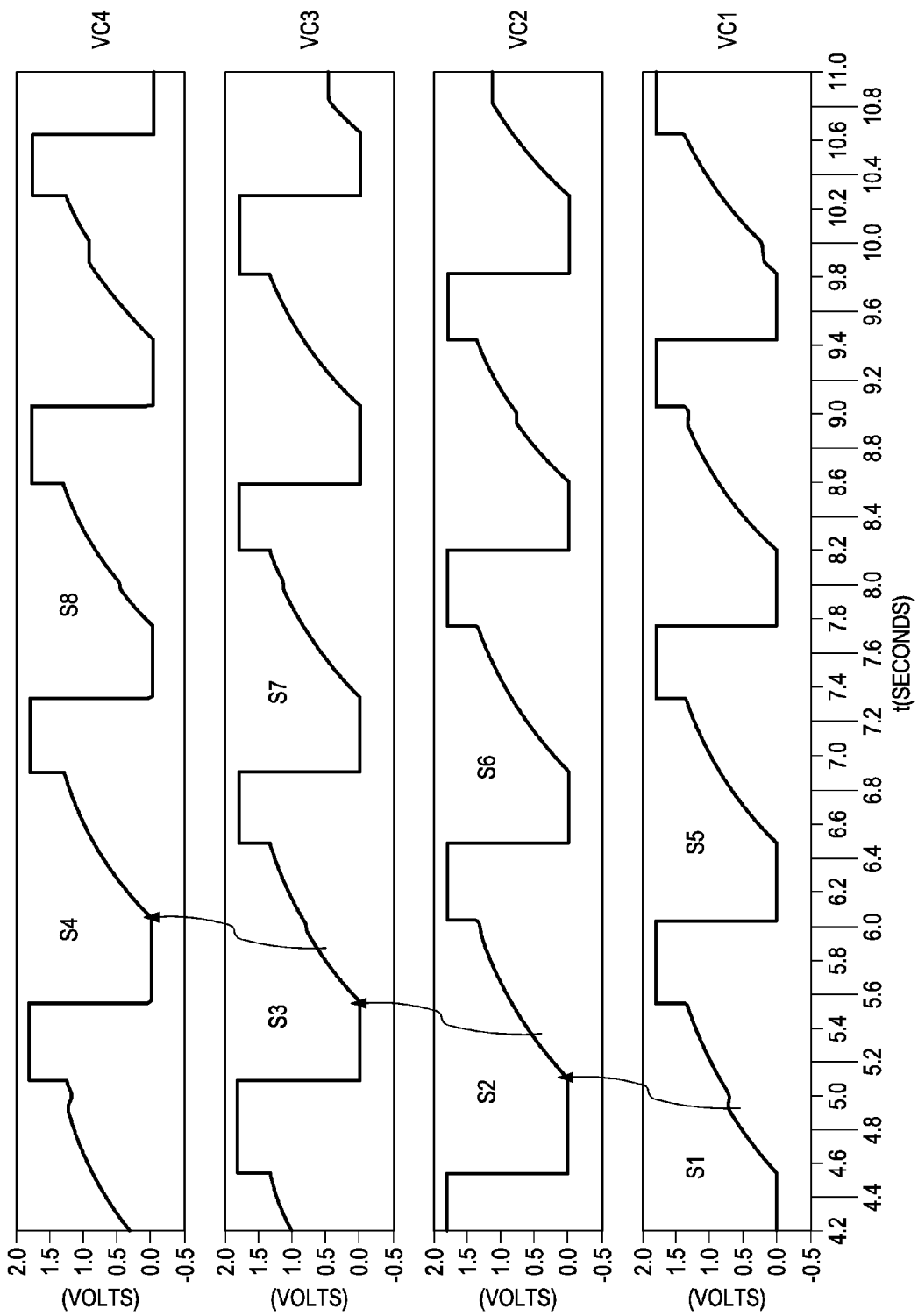
FIG. 6 shows simplified waveforms illustrating the charging principle of shared capacitors according to an embodiment of the invention.

FIG. 6 shows waveforms relating to the charging procedure of the capacitors of the embodiment shown in FIG. 4. There are four diagrams (a), (b), (c), (d). The first diagram (a) relates to the voltage across capacitor C4. The second (b) relates to the voltage across capacitor C3, the third relates to the voltage drop across capacitor C2 and the fourth diagram relates to the voltage drop across capacitor C1. Accordingly, these voltage drops represent the voltages at respective storage nodes of the storage elements which are coupled to the shared capacitors. The reference signs S1 to S8 relate to storage elements S1 to S8. Starting with diagram (d) it can be seen that storage element S1 starts with charging capacitor C1. Accordingly, voltage VC1 increases smoothly until about half the supply voltage level is reached. At about half the supply voltage level VDD/2, storage element S2 (next neighbor to storage element S1) starts charging capacitor C2. Accordingly, the voltage level VC2 across capacitor C2 increases smoothly until about half the supply voltage level VDD/2 is reached. As soon as VC2 reaches VDD/2, the third storage element (next neighbor to storage element S2) starts charging capacitor C3. If the voltage VC3 across capacitor C3 reaches VDD/2 the fourth storage element S4 (next neighbor to storage element S3) starts charging capacitor C4. However, as soon as storage element S3 starts charging capacitor C3 and the voltage level VC3 reaches VDD/2, capacitor C1 is discharged. Capacitor C1 can then be used by storage element S5. Capacitor C2 can be used by storage element S6, capacitor C3 can be used by storage element S7 and capacitor C4 can be used by storage element S8 for smoothly increasing the frequency in response to an UP-signal from the phase frequency detector PFD.

Figure 7:
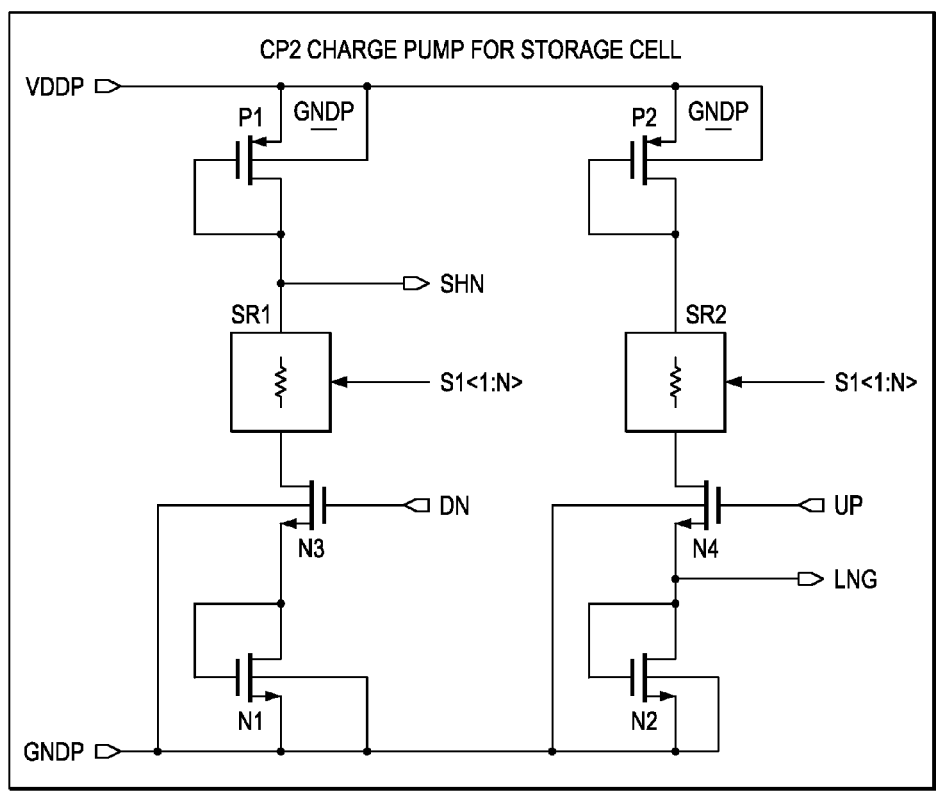
FIG. 7 shows a charge pump to be used for the storage element according to an embodiment of the invention.

FIG. 7 shows a simplified circuit diagram of a charge pump for a storage element Si according to an embodiment of the invention. FIG. 7 shows a possible implementation of the charge pump CP2 shown in FIG. 2. The input signals UP and DN received from the phase frequency detector PFD are connected to the gates of NMOS transistors N3 and N4, respectively. These transistors act as switches. PMOS transistor P1 and NMOS transistor N2 form two current mirrors through signals SHN and LNG and inside the storage elements with PMOS transistor P1 and NMOS transistor N2. PMOS transistors P1 and P2 and NMOS transistors N3 and N4 as well as NMOS transistors N1 and N2 are matched and should have exactly the same width-to-length-ratio and other properties. This means that the current through the two branches will be the same. The stages SR1 and SR2 consist of series of the resistors, which is explained in more detail with respect to FIG. 9. The stages SR1 and SR2 serve to adjust the currents through the branches in order to compensate process, temperature and voltage variations (PVT compensation).

Figure 8:
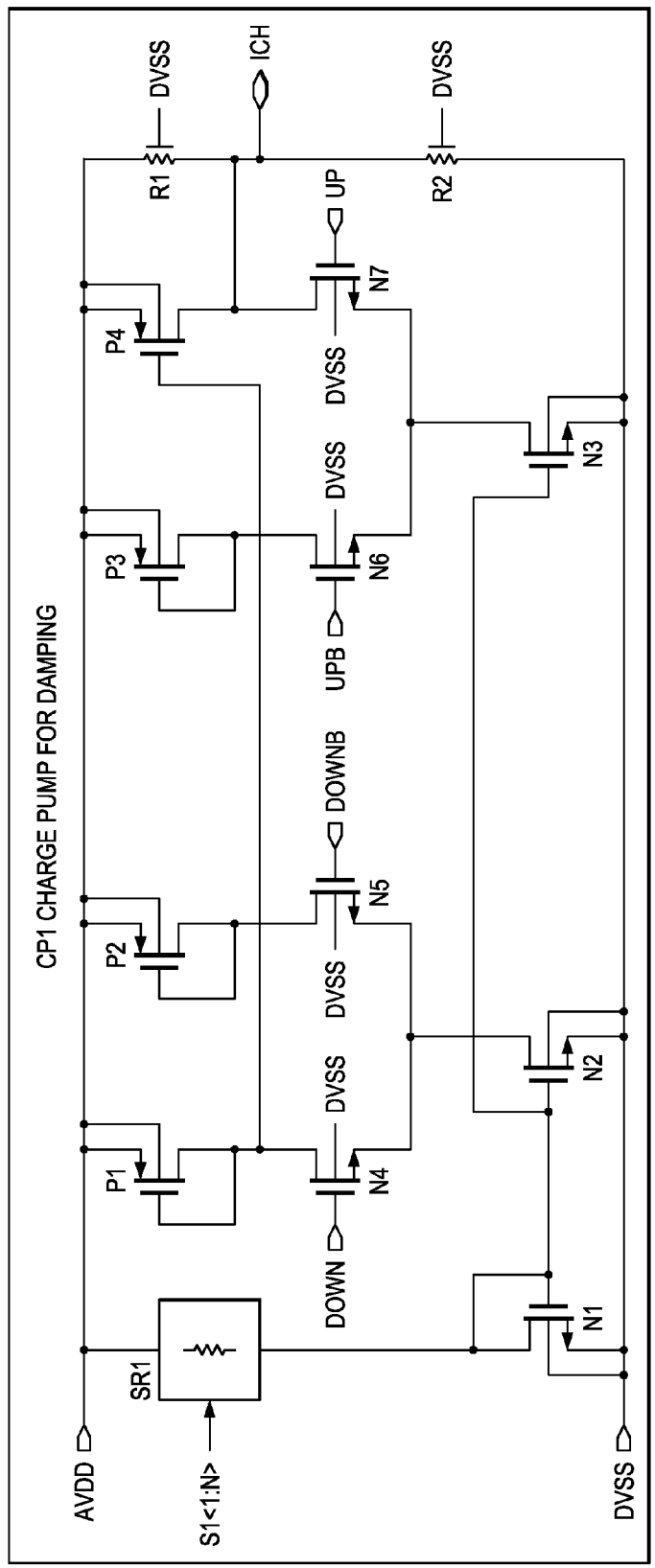
FIG. 8 shows a charge pump for damping the phase locked loop according to an embodiment of the invention.

FIG. 8 shows a simplified circuit diagram of an embodiment of the first charge pump CP1 shown in FIG. 2. The charge pump also receives the up and down signals (DOWN, UP, UPB and DOWNB) from the phase frequency detector. There is also a stage SR1 similar to the stages SR1 and SR2 shown in FIG. 7. This stage SR2 is used to define the current through NMOS transistor N1. The current through NMOS transistor N1 is mirrored into NMOS transistors N2 and N3. The resistors R1 and R2 form a voltage divider that generates half the supply voltage level AVDD. If signal DOWN changes from low to high, PMOS transistor P1 starts to mirror current to PMOS transistor P4 which in turn supplies current to node ICH. A capacitance is coupled as shown in FIG. 2 to node ICH. If signal UP turns high, then NMOS transistor N7 is turned on and sinks the current from node ICH. In the normal operation of the phase locked loop, a sequence of up and down pulses will be produced by the phase frequency detector which will then supply or sink current from the capacitor connected to ICH. This will in turn provide a voltage jump or drop for each up or down pulse. However, if no pulses up or down are present, the resistive divider R1, R2 pulls the voltage level at ICH to AVDD/2.

Figure 9:
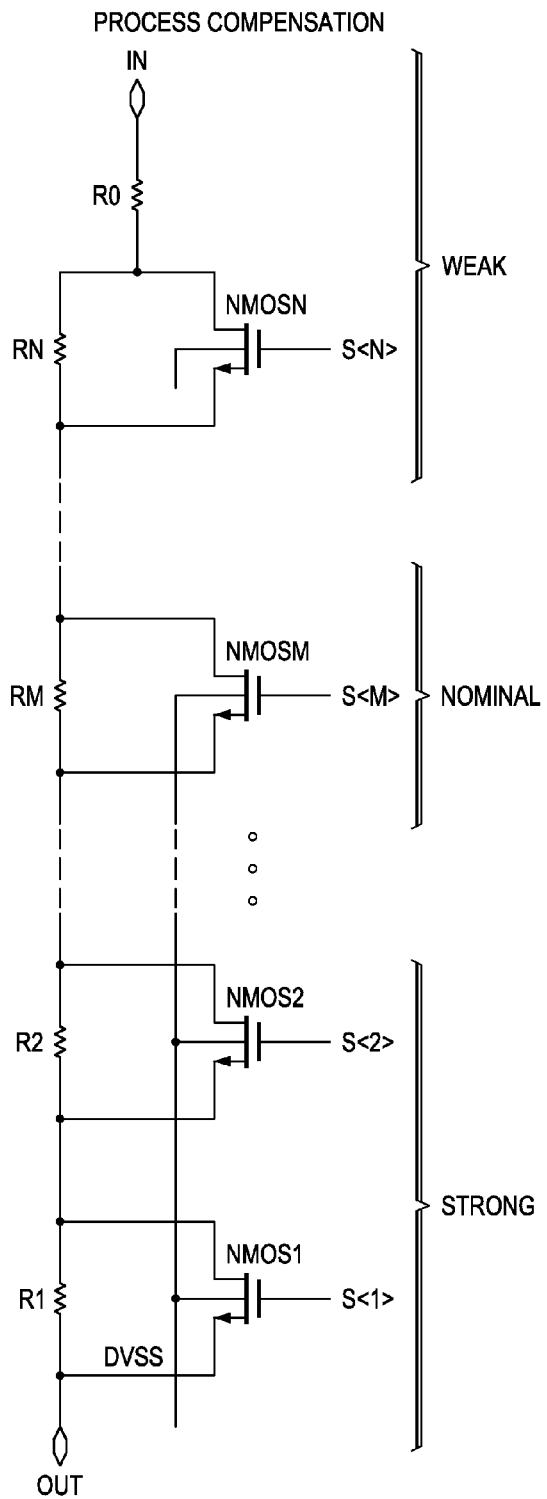
FIG. 9 shows a configuration for compensating process variations in a simplified circuit diagram according to an embodiment of the invention.

FIG. 9 shows a simplified circuit diagram of the stages SR1 and SR2. A number of resistors R1 to RN is coupled in series. Each resistor R1 to RN is coupled by corresponding NMOS transistor NMOS1 to NMOSN. The resistance of the series of resistors and NMOS transistors is reduced by switching the NMOS transistors NMOS1 to NMOSN on. The resistance is maximum if none of the transistors is switched on and minimum if all transistors are switched on. This can be used in order to adjust a current for compensating process, temperature or supply voltage variations.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device comprising a phase locked loop (PLL) including a phase frequency detector (PFD) a first charge pump (CP1); a controlled oscillator (VCO), a divider (DIV), a second charge pump (CP2) and control stage (DCONT); wherein an output of the phase frequency detector (PFD) is coupled to the first charge pump (CP1) and an output of the first charge pump (CP1) is coupled to a first control input of the controlled oscillator (VCO), the output of the phase frequency detector (PFD) is also coupled to an input of the second charge pump (CP2), an output of the second charge pump (CP2) is coupled to an input of the control stage (DCONT), an output of the control stage (DCONT) is coupled to a second control input of the controlled oscillator (VCO), an output of the controlled oscillator (VCO) is coupled to an input of the divider (DIV), an output of the divider is coupled to an input of the phase frequency detector (PFD), the control stage (DCONT) comprising N storage elements (S1, . . . ,SN) each having an output coupled to the output of the control stage (DCONT), the N storage elements being coupled in a chain such that each storage element (Si) except the first (S1) and the last storage element (SN) in the chain is coupled to a preceding storage element (Si−K1) and a subsequent storage element (Si+K2), and each storage element being configurable in an analog mode in which a stored signal at the storage node of the storage element is changed continuously in response to the output signal of the second charge pump (CP2) and each storage element is configurable in a digital mode in which the stored value is one value out of a predetermined set of values and the storage element being further configured to assume the analog mode if a preceding storage element and a subsequent storage element are in the digital mode and have different values of the stored signal, and wherein at least two storage elements share a storage capacitance for storing the stored signal at the storage node.

2. The electronic device according to claim 1, wherein the at least two storage elements which share a storage capacitor are not direct neighbors in the chain of storage elements.

3. The electronic device according to claim 1, wherein k storage capacitances are provided which are shared among all storage elements and wherein k is an integer number greater than 2.

4. The electronic device according to claim 1, wherein k is equal to four.

5. The electronic device according to anyone of the preceding claims, wherein the storage element is further configured to assume the digital mode if the preceding storage element and the subsequent storage element are in digital mode and have the same values of the stored signal.

6. The electronic device according to claim 1, wherein the two values of the stored signal of the storage element in the digital mode are a minimum and maximum.

7. The electronic device according to claim 1, wherein two or more adjacent storage elements (Si, Si+1) are simultaneously in analog operation mode.

8. The electronic device according to claim 1, wherein each storage element comprises a transmission gate which is coupled between the storage node and a storage capacitor.

9. The electronic device according to claim 8, wherein the transmission gate of each storage element is controlled by an output of a storage element that is not a direct neighbor of the storage element.

10. The electronic device according to claim 1, wherein each storage element is configured to produce an output signal (D) which is a function of the stored signal and fed to the controlled oscillator for adapting the oscillation frequency of the controlled oscillator (VCO).

11. The electronic device according to claim 1, wherein the storage node of each storage element is coupled to a gate of a transistor for controlling a current through the transistor which is then used as the output signal (D) of the storage element and coupled to the second input of the controlled oscillator.

12. The electronic device according to claim 1, wherein the storage element comprises a first switch and a second switch and wherein the first switch is coupled between a first supply voltage and the storage node and the second switch is coupled between a second supply voltage and the storage node and the first switch is configured to switch in response to the stored signal of the preceding storage element and the stored signal of the subsequent storage element and the second switch is configured to switch in response to the stored signal of the subsequent storage element and the stored signal of the preceding storage element such that the first switch is only closed (connecting) when both stored signals are below a threshold level and the second switch is only closed (connecting) when both stored signals are above a threshold level.

13. A method of controlling a controlled oscillator comprising the steps of: determining a phase and/or frequency difference between an output clock signal of the controlled oscillator and a reference clock signal, generating an first input signal for the controlled oscillator for fine tuning the frequency of the controlled oscillator based on the determined phase and/or frequency difference, generating a second input signal for the controlled oscillator for rough tuning based on the determined phase and/or frequency difference, wherein the second signal comprises a first set of digital signals, a second set of digital signals and an analog signal indicating an intermediate value between the first set of digital signals and the second set of digital signals.

* * * * *